US009450555B2

(12) United States Patent
Sorensen et al.

(10) Patent No.: US 9,450,555 B2
(45) Date of Patent: Sep. 20, 2016

(54) GAIN CONTROL FOR AN AUDIO SIGNAL

(75) Inventors: Karsten Vandborg Sorensen, Stockholm (SE); Jon Bergenheim, Uppsala (SE); Koen Vos, San Francisco, CA (US)

(73) Assignee: Skype, Dublin (IE)

( * ) Notice: Subject to any disclaimer, the term of this patent is extended or adjusted under 35 U.S.C. 154(b) by 932 days.

(21) Appl. No.: 12/803,291

(22) Filed: Jun. 23, 2010

(65) Prior Publication Data

US 2011/0112668 A1 May 12, 2011

(30) Foreign Application Priority Data

Nov. 10, 2009 (GB) ................................. 0919673.4
Nov. 26, 2009 (GB) ................................. 0920733.3

(51) Int. Cl.
*G10L 21/0208* (2013.01)
*H03G 3/32* (2006.01)

(52) U.S. Cl.
CPC ............. *H03G 3/32* (2013.01); *G10L 21/0208* (2013.01)

(58) Field of Classification Search
CPC ............... G10L 21/02; G10L 21/0205; G10L 21/0208; G10L 21/0232; G10L 25/78; G10L 25/93; H03G 3/3005; H03G 3/3089; H03G 3/32
USPC .......... 381/94.1–94.9; 700/94; 704/210, 225, 704/233
See application file for complete search history.

(56) References Cited

U.S. PATENT DOCUMENTS 4,514,703 A    4/1985  Maher et al.
6,122,331 A *  9/2000  Dumas .......................... 375/345
2003/0187640 A1* 10/2003 Otani et al. ................... 704/233
2006/0050895 A1*  3/2006 Nemoto et al. ............... 381/94.5
2009/0010453 A1*  1/2009 Zurek et al. .................. 381/94.5
2010/0145689 A1   6/2010 Li et al.
2010/0198377 A1*  8/2010 Seefeldt et al. ................ 700/94

FOREIGN PATENT DOCUMENTS

EP    1 349 149 A2   10/2003
EP    1 630 792 A1    3/2006

OTHER PUBLICATIONS

"Search Report", GB Application No. 0920733.3, (Mar. 4, 2011), 1 page.
Notification of Transmittal of the Internatiioanl Search Report and the Written Opinion of the International Searching Authority, or the Declaration, PCT/EP2010/066946, dated Feb. 10, 2011, 13 pp.
"Foreign Office Action", GB Application No. 0920733.3, Apr. 6, 2016, 3 pages.
"Foreign Office Action", EP Application No. 10776104.1, May 22, 2015, 7 pages.

* cited by examiner

*Primary Examiner* — Duc Nguyen
*Assistant Examiner* — Alexander Eljaiek
(74) *Attorney, Agent, or Firm* — Tom Wong; Micky Minhas

(57) ABSTRACT

A method and system for modifying an audio signal, the method comprising: receiving the audio signal at signal processing means; analysing the received audio signal to identify characteristic signal components in the audio signal; determining that another signal is input to the signal processing means, the input signal resulting from an activity which generates noise in the audio signal; and selectively applying an adjusted gain to the audio signal based on the determination that the input signal is input to the signal processing means, wherein the adjusted gain is generated in dependence upon the signal strength of the identified signal components.

24 Claims, 4 Drawing Sheets

GAIN CONTROL FOR AN AUDIO SIGNAL

RELATED APPLICATION

This application claims priority under 35 U.S.C. §119 or 365 to Great Britain Application No. 0919673.4, filed Nov. 10, 2009 and Great Britain Application No. 0920733.3, filed Nov. 26, 2009. The entire teachings of the above applications are incorporated herein by reference.

FIELD OF THE INVENTION

This invention relates to gain control for an audio signal, for example gain control for an audio signal comprising speech and noise.

BACKGROUND

An audio signal can be received at a computing system, such as a personal computer or a telephone, and the level of the audio signal can be adjusted by applying a gain to the audio signal. An Automatic Gain Control (AGC) mechanism can be used to automatically adjust the gain applied to the audio signal to ensure that the level of the audio signal is maintained within an acceptable range. The AGC mechanism effectively reduces the level of the audio signal if the received audio signal has a high signal strength and increases the level of the audio signal if the received audio signal has a low signal strength.

A user may enter into a call with another user, such as a private call (with just two users in the call) or a conference call (with more than two users in the call). The user's speech can be received at a microphone and then transmitted over a network to the other user(s) in the call. The audio signals received at the microphone will typically include speech components from the user and also noise from the surrounding environment. The AGC mechanism aims to adjust the gain applied to the audio signal based on the level of the received speech components of the audio signal, without adjusting the gain based on the level of the noise in the received audio signal. In this way, the level of the audio signal is automatically controlled such that the level of the speech in the audio signal is maintained within an acceptable range. In order to achieve this, the AGC mechanism analyses the received audio signal to distinguish between speech components and noise. As part of this analysis, AGC mechanisms often use some kind of signal classification in which specific characteristics of speech signals (such as the pitch frequency, spectral tilt, zero-crossing rate and other signal characteristics) are used to identify components in the audio signal as speech components, wherein only those identified components are used by the AGC mechanism to adjust the gain applied to the audio signal. In this way, signal components such as background noise which do not have the specific characteristics of speech signals will not affect the adjustment of the gain applied to the audio signal.

The AGC mechanism is typically not perfect in identifying speech components in the received audio signal. For example, if the AGC mechanism is too limited in the specific characteristics which are identified as speech components then fewer of the speech components in the audio signal will be identified as such, resulting the in the AGC mechanism changing the level of the audio too slowly. On the other hand, if the AGC mechanism is too broad in the characteristics which are identified as speech components then non-speech sounds in the audio signal may be identified as speech components, such that the level of the audio signal may be changed according to non-speech signals which can be problematic.

When a user operates a computer, noises are often generated. For example when a key on a computer keyboard is pressed there is a short mechanical sound (i.e. a clicking sound). Similarly, when the buttons on a mouse are pressed a clicking sound is produced. When a user is operating a peripheral device of a computer at the same time as partaking in a call, the noise generated by the user's operation of the peripheral device may be included in the audio signal. For example, clicking noise such as the sound from a key stroke on a keyboard might be picked up by the microphone. Keyboard tapping can be a problem for AGC mechanisms because the keyboard tapping can be mistaken for speech components in the audio. This can result in the AGC mechanism changing the level of the audio signal on the basis of the signal level of the keyboard taps in the audio signal.

In the case where the level of the keyboard tapping is lower than the level of the normal speech (as received at the computing system), but the keyboard tapping is audible and detectable and is mistaken for speech, the AGC mechanism might increase the gain so that the level of the keyboard tapping is amplified to be within the acceptable range for speech signals. The keyboard tapping can then interfere with usage of the audio signal, for example, the amplified keyboard tapping can be quite disturbing for other users in a call. The gain applied by the AGC mechanism is therefore higher than is needed for the speech of the user, such that when the user starts speaking his speech would be amplified more than normal which could interfere with the call. If the level of the speech is amplified too much, the speech may overload the system resulting in clipping and/or the need for compression o the speech signal which both will distort the speech. The AGC mechanism would have to reduce the gain to be better suited for the input speech level. This will take some time, and during that time, the level of the speech in the audio signal will be above the acceptable level, which may disrupt the call.

Conversely, in the case where the level of the keyboard tapping is higher than the level of the normal speech (as received at the computing system) such as in a laptop in which the microphone and the keyboard are integrated into the laptop body, and the generated noise is mistaken as speech, the AGC mechanism might decrease the gain so that the level of the keyboard tapping is reduced to be within the acceptable range for speech signals. When the user then speaks, his speech will not be amplified sufficiently to fall within the acceptable range (i.e. the speech might have a worse than necessary signal-to-quantization noise ratio). The AGC would then need to increase the gain to bring the level of the speech up to within the acceptable range. This will take some time, and during that time, the level of the speech in the audio signal will be below the acceptable level range, which may disrupt the call. In an extreme case, the gain applied by the AGC mechanism will be reduced so much due to the keyboard tapping that the speech will be too quiet to be identified as speech and so the AGC mechanism will be unable to increase the gain when the user is speaking and the call might not be able to continue (because the speech cannot be heard) without some kind of human intervention, such as resetting the gain level manually.

One approach for reducing the effect of keyboard tapping on the gain level of the AGC mechanism is to use specific keyboard noise attenuation algorithms for attenuating keyboard noise. By attenuating the keyboard noise it is less likely that the keyboard noise will be mistaken for speech in the audio signal. Keyboard noise attenuation algorithms analyse the audio signal received at the microphone to detect and filter out components of the audio signal that are perceived to be keyboard clicking noise. However, keyboard noise attenuation algorithms tend to introduce delay in the signal path if they are to reliably detect and attenuate keyboard tapping. Furthermore, the keyboard attenuation algorithms will not typically be perfect such that some keyboard tapping is undetected and will therefore affect the gain applied by the AGC mechanism. Furthermore, the detection and attenuation of keyboard tapping from the audio signal introduces additional computational complexity which can use up valuable processing resources in the computing system.

There is therefore a problem of applying a gain with an AGC mechanism to an audio signal received at a computing system in the presence of noise in that the noise in the audio signal can be mistakenly identified as speech resulting in inappropriate adjustment of the gain to be applied by the AGC mechanism.

SUMMARY

In a first aspect of the invention there is provided a method of modifying an audio signal, the method comprising: receiving the audio signal at signal processing means; analysing the received audio signal to identify characteristic signal components in the audio signal; determining that another signal is input to the signal processing means, the input signal resulting from an activity which generates noise in the audio signal; and selectively applying an adjusted gain to the audio signal based on the determination that the input signal is input to the signal processing means, wherein the adjusted gain is generated in dependence upon the signal strength of the identified signal components.

In a second aspect of the invention there is provided a computing system for modifying an audio signal, the computing system comprising: receiving means for receiving the audio signal; input means for generating an input signal; signal processing means for analysing the received audio signal to identify characteristic signal components in the audio signal, and for determining that the input signal is input from the input means, the input signal resulting from an activity which generates noise in the audio signal; and gain control means for selectively applying an adjusted gain to the audio signal based on the determination that the input signal is input from the input means, the adjusted gain being generated in dependence upon the signal strength of the identified signal components.

The problem of noise generated by the operation of input devices affecting the applied gains is addressed without adding any significant computational complexity. This is achieved by cancelling or reverting adjustments made by the AGC mechanism at times when noise generating activity is carried out on an input device. It is determined that the noise generating activity is carried out using event signaling obtained from the operating system of the computing system.

The operating system is typically informed of the presence of an input signal from a device driver associated with the input device at which the input signal is generated. Where the input signals are generated by a process that generates noise, that noise may be picked up at the microphone such that it is included in the audio signal. Without analysing the received audio signal (and without performing computationally complex operations on the audio signal), the operating system of the computing system can report that the generated noise is likely to be present in the received audio signal by using the input signals received at the computing system. Any adjustments made by the AGC during a time period in which the noise generating activity is occurring are cancelled or reverted. In this way, adjustments to the gain applied to the audio signal can only be made based on the audio signal received during periods in which no input signals are received which are associated with noise generating activities. The input signals are not audio signals. The input signals could be electrical signals, but the signals could also be transmitted over a wireless connection. A software driver associated with the input device typically determines that the input signal has been generated and sends a message to the operating system to inform the operating system that the input signal has been generated.

BRIEF DESCRIPTION OF THE DRAWINGS

For a better understanding of the present invention and to show how the same may be put into effect, reference will now be made, by way of example, to the following drawings in which.

DETAILED DESCRIPTION OF PREFERRED EMBODIMENTS

Figure 1:
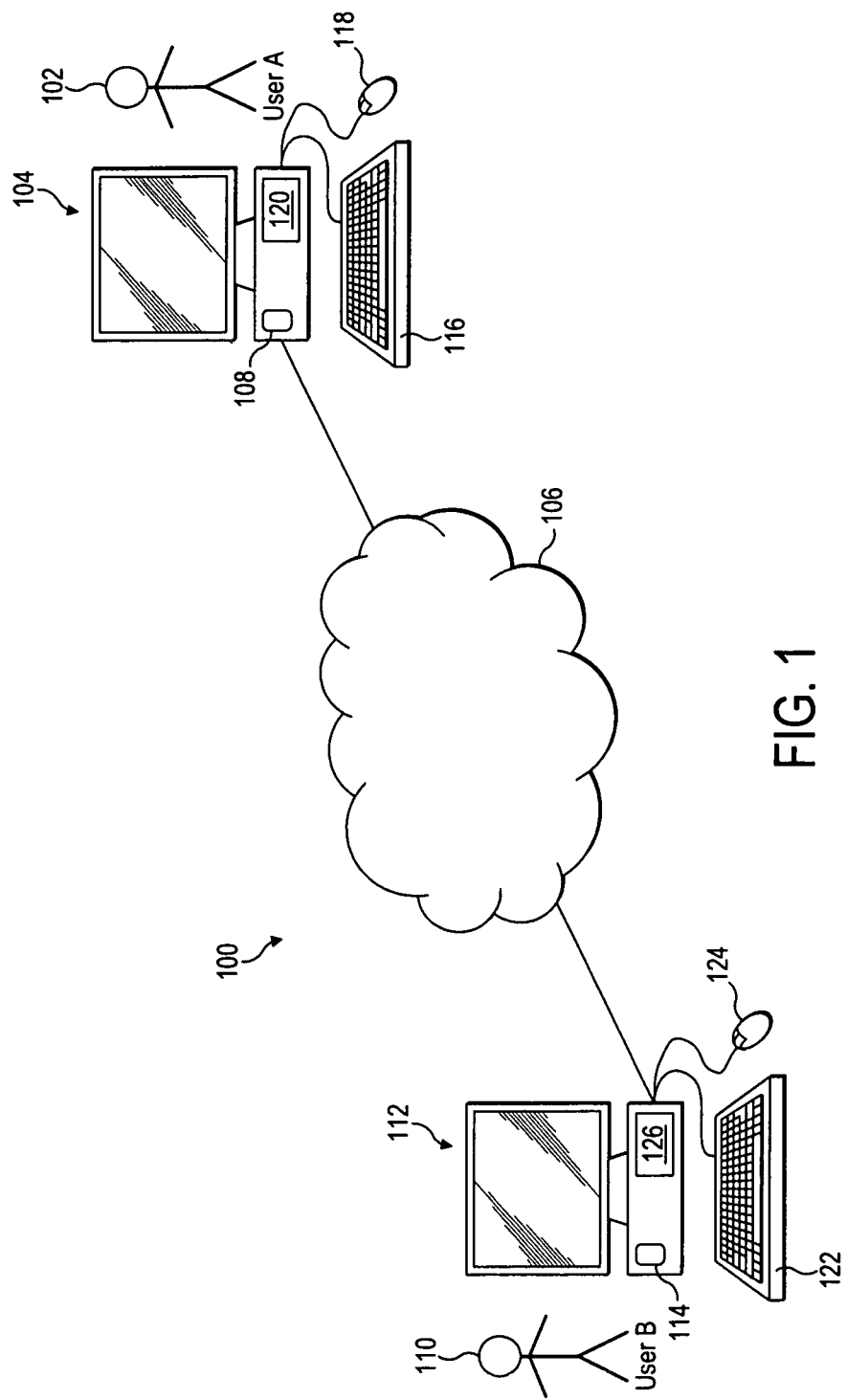
FIG. 1 shows a P2P network built on top of packet-based communication system.

Reference is first made to FIG. 1, which illustrates a communication system 100 such as a packet-based P2P communication system. A first user of the communication system (User A 102) operates a user terminal 104, which is shown connected to a network 106. The communication system 100 utilises a network such as the Internet. The user terminal 104 may be, for example, a personal computer ("PC") (including, for example, Windows™, Mac OS™ and Linux™ PCs), a mobile phone, a personal digital assistant ("PDA"), a television, a remote control, a gaming device or other embedded device able to connect to the network 106. The user device 104 is arranged to receive information from and output information to a user 102 of the device. The user terminal 104 comprises a microphone 120 for receiving audio signals. In a preferred embodiment the user device 104 comprises a display such as a screen and input devices such as a keyboard 116, mouse 118, keypad, buttons, joystick and/or touch-screen.

The user terminal 104 is running a communication client 108, provided by a software provider. The communication client 108 is a software program executed on a local processor in the user terminal 104.

Figure 2:
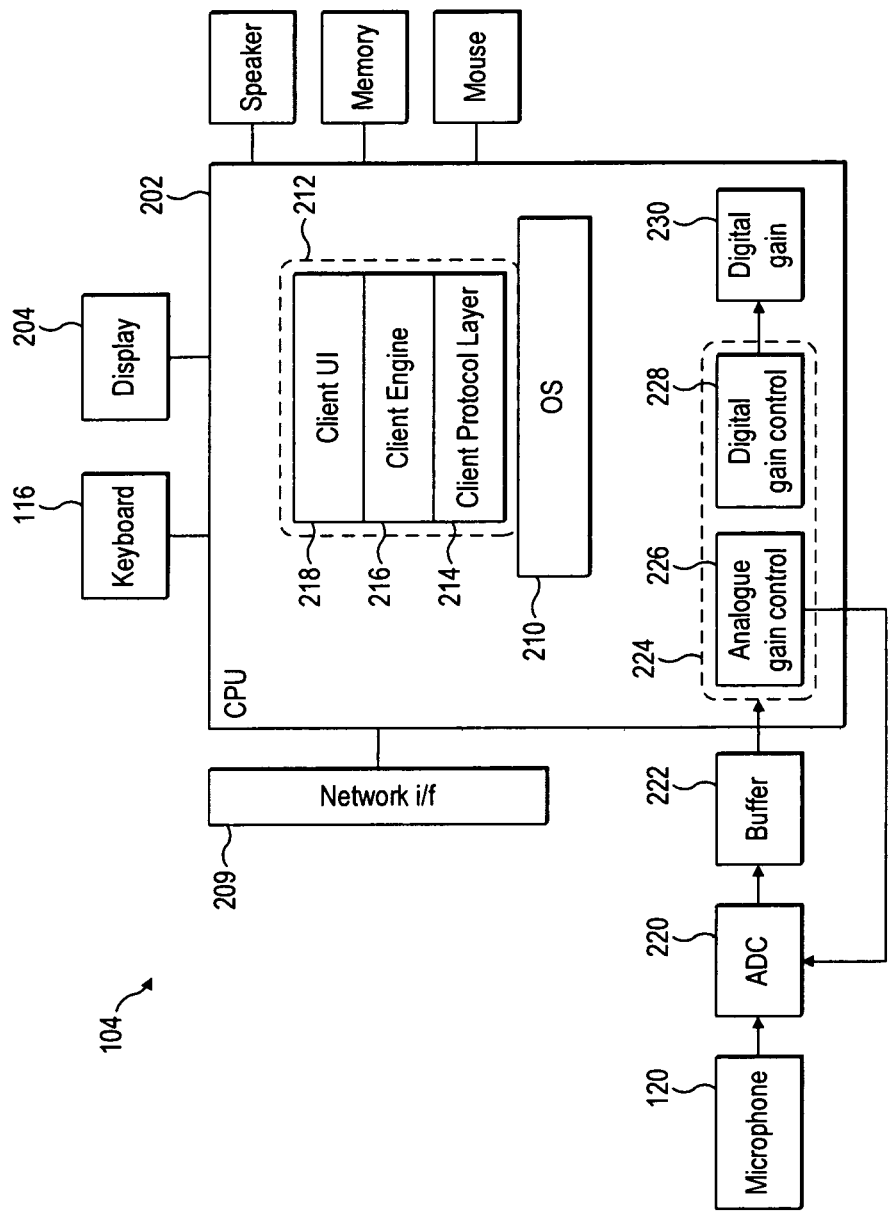
FIG. 2 shows a schematic view of a user terminal according to a preferred embodiment.

FIG. 2 illustrates a schematic view of the user terminal 104 on which is executed client 108. The user terminal 104 comprises a central processing unit ("CPU") 202, to which is connected a display 204 such as a screen, input devices such as keyboard 116 and a pointing device such as mouse 118. The display 204 may comprise a touch screen for inputting data to the CPU 202. An output audio device 206 (e.g. a speaker) is connected to the CPU 202. The display 204, keyboard 116, and mouse 118 are not integrated into the user terminal 104 in preferred embodiments and are connected to the CPU 202 via respective interfaces (such as a USB interface), but in alternative user terminals (such as laptops) the display 204, the keyboard 116, the mouse 118 and the output audio device 206 may be integrated into the user terminal 104. The CPU 202 is connected to a memory 208 and a network interface 209 such as a modem for communication with the network 106. The network interface 209 may be integrated into the user terminal 104 as shown in FIG. 2. In alternative user terminals the network interface 209 is not integrated into the user terminal 104.

FIG. 2 also illustrates an operating system ("OS") 210 executed on the CPU 202. Running on top of the OS 210 is a software stack 212 for the client 108. The software stack shows a client protocol layer 214, a client engine layer 216 and a client user interface layer ("UI") 218. Each layer is responsible for specific functions. Because each layer usually communicates with two other layers, they are regarded as being arranged in a stack as shown in FIG. 2. The operating system 210 manages the hardware resources of the computer and handles data being transmitted to and from the network via the network interface 209. The client protocol layer 214 of the client software communicates with the operating system 210 and manages the connections over the communication system. Processes requiring higher level processing are passed to the client engine layer 216. The client engine 216 also communicates with the client user interface layer 218. The client engine 216 may be arranged to control the client user interface layer 218 to present information to the user via a user interface of the client and to receive information from the user via the user interface.

The user terminal 104 also includes microphone 120, analogue to digital converter block 220, buffer 222, pre-processor block 224 and digital gain block 230. The pre-processor block 224 comprises analogue gain control means 226 and digital gain control means 228. An output of the microphone 120 is connected to an input of the analogue to digital converter block 220. An output of the analogue to digital converter block 220 is connected to an input of the buffer 222. An output of the buffer 222 is connected to an input of the pre-processor block 224. An output of the pre-processor block 224 is connected to an input of the digital gain block 230. An output of the analogue gain control means 226 is connected to an input of the analogue to digital convert block 220. The pre-processor block 224 and the digital gain block 230 are implemented in software and are executed on the CPU 202. In some embodiments the pre-processor block 224 and the digital gain block 230 are part of the client engine software block 216 running on the CPU 202. The analogue to digital converter block 220 and the buffer 222 reside on a sound card in the computing system (not shown in the Figure). The CPU 202, analogue to digital converter block 220, buffer 222, pre-processor block 224, digital gain block 230 and any drivers of the input means can be considered signal processing means of the user terminal 104.

Figure 3:
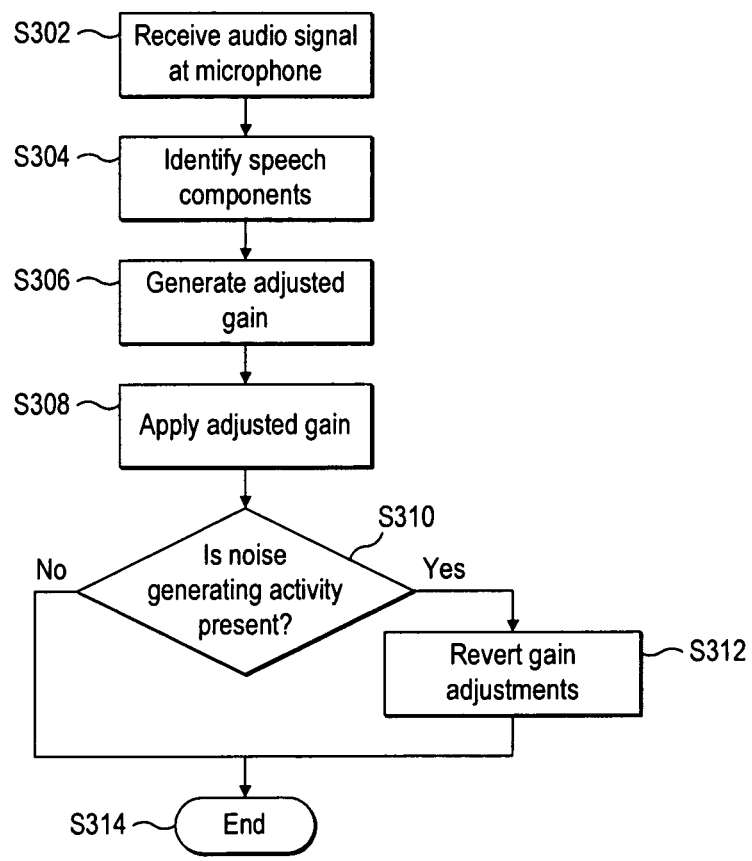
FIG. 3 is a flowchart of a process for applying gain to an audio signal according to a first embodiment.

With reference to FIG. 3 there is now described a process for applying gain to an audio signal according to a first embodiment using the user terminal 104 shown in FIG. 2. In step S302 an audio signal is received at the microphone 120 of the user terminal 104. The audio signal may include speech from User A and may be for use in a communication event, such as a call with User B over the network 106. The audio signal typically also includes noise. For example, the acoustic noise that pressing a key on the keyboard 116 generates will be captured by the microphone 120 when the sound pressure wave has travelled the distance between the keyboard 116 and the microphone 120. The keyboard and the microphone are generally both in close proximity to the user and so will typically be no more than 1 meter apart, in which case the noise generated by the key stroke will typically arrive at the microphone less than 3 ms after the key is pressed on the keyboard 116. The audio signal received at the microphone 120 passes to the analogue to digital converter block 220 and is converted from the analogue domain to the digital domain. The audio signal is then passed to the buffer 222 where it is stored.

The pre-processor block 224 reads the audio signal from the buffer 222. In step S304 the pre-processor block 224 analyses the audio signal to identify speech components. That is to say, signal components having speech characteristics are identified in the audio signal. In step S306 the pre-processor block 224 generates an adjusted gain based on the signal strength of the identified components in the audio signal. The adjusted gain may be an analogue adjusted gain as determined by the analogue gain control means 226. Analogue gain is applied to the audio signal when the audio signal is in the analogue domain, for example in the analogue to digital converter block 220, as represented in the Figure with the arrow between the analogue gain control means 226 and the analogue to digital converter block 220. Alternatively the adjusted gain may be a digital adjusted gain as determined by the digital gain control means 228. Digital gain is applied to the audio signal when the audio signal is in the digital domain, for example in the digital gain block 230. In some scenarios, the adjusted gain may comprise both an analogue adjusted gain to be applied to the audio signal in the analogue domain and a digital adjusted gain to be applied to the audio signal in the digital domain. The time delay between receiving the audio signal at the microphone 120 and the generation of the adjusted gain in the pre-processor block 224 is a time $t_1$ and is typically in the range 5-30 ms. This time delay is primarily due to the buffering of the audio signal in the buffer 222.

The audio signal passes from the pre-processor block 224 to the digital gain block 230. In step S308, the digital gain block 230 applies digital gain to the audio signal. Where an adjusted digital gain has been generated in the pre-processor 224, the adjusted digital gain is applied to the audio signal. Where an adjusted digital gain has not been generated, an unadjusted digital gain is applied to the audio signal in the digital gain block 230. The unadjusted digital gain is the digital gain applied by the digital gain block 230 at the time when the audio signal is received at the microphone 120. This means that the unadjusted digital gain is the digital gain that has been previously generated in the pre-processor block 224 based upon the signal strength of the identified speech components in previously received portions of the audio signal. In this way the unadjusted digital gain is unaffected by portions of the audio signal received after the input signal is input to the computing system.

Similarly, in step S308 where an adjusted analogue gain has been generated in the pre-processor block 224, the analogue to digital converter block 220 is instructed to apply the adjusted analogue gain to portions of the audio signal that are subsequently received. Where an adjusted analogue gain has not been generated the analogue to digital converter block 220 continues to apply the same analogue gain as it was applying before the audio signal was received, i.e. an unadjusted analogue gain. The unadjusted analogue gain is the analogue gain that has previously been generated in the pre-processor block 224 based upon the signal strength of the identified speech components in previously received portions of the audio signal. In this way the unadjusted analogue gain is unaffected by portions of the audio signal received after the input signal is input to the computing system.

When it is necessary to alter the gain applied to the signal quickly, altering the digital gain is often preferable to altering the analogue gain. The process of altering the digital gain takes less time than that of altering the analogue gain.

So, in step S308 the adjusted gain (which may be analogue gain, digital gain, or both) is applied to the audio signal.

In step S310 it is determined at the operating system 210 whether input signals have been input at a device (or input means) connected to the CPU 302, such as the keyboard 116 or the mouse 118. The input signals are not audio signals. The input signals indicate data from the device, for example the input signals may represent key strokes on the keyboard 116. The input means which inputs the input signals to the CPU 302 is not the microphone 120, and does not receive audio signals. The input signals are typically caused by activity on the input means connected to the user terminal 104. Device drivers associated with the input device detect the generation of the input signal and inform the operating system of the input signal. For example keyboard activity on the keyboard 116 will produce input signals to the operating system 210 as the keys are pressed. When the keys on the keyboard 116 are pressed, audible clicking noise will be generated, and this clicking noise may contribute to the noise in the audio signal received at the microphone 120. Operating systems generally allow software to monitor activity on inputs, such as keyboard activity. One way to allow this is to look for events that are sent out by the operating system. Another way of detecting the input signals is with an Application Programming Interface (API) which allows the state of the input to be accessed, for example the state of each key of the keyboard 116 can be accessed through an API. By using such an API, the pre-processor block 224 can be informed if a key is pressed. It is determined whether any of the detected inputs will generate noise that may be included in the audio signal received at the microphone 120, and in that way it is determined whether noise generating activity is present at the input devices. This determination of whether noise generating activity is present does not rely on analysing the received audio signal, and therefore avoids computationally complex signal processing.

The determination by the operating system that input signals have been generated on an input device takes a time $t_2$ which is typically within the range 50 to 100 ms from the time that the input signal is input to the computing system. It is apparent that the delay ($t_2$) involved in detecting an input signal (50 to 100 ms) is greater than the delay ($t_1$) involved in generating the adjusted gain (5 to 30 ms) as described above. Therefore, where a noise generating activity causes an input signal to be generated (e.g. a key is pressed on the keyboard 116), the gain is adjusted and applied before the input signal is detected by the operating system. Therefore, if noise generating activity is determined to be present in step S310 then the method passes to step S312 in which any gain adjustments made within a time period $t_2$ before the detection of the input signal are reverted. In other words, the gain applied to the signal (both analogue and digital gain) is reverted back to the unadjusted gain, i.e. the gain that was applied a time $t_2$ ago, discarding any gain adjustments that have been made since that time. The method then ends in step S314. If no noise generating activity is present, as determined in step S310, then the method passes straight from step S310 to step S314, without reverting any gain adjustments, i.e. without performing step S312.

Figure 4:
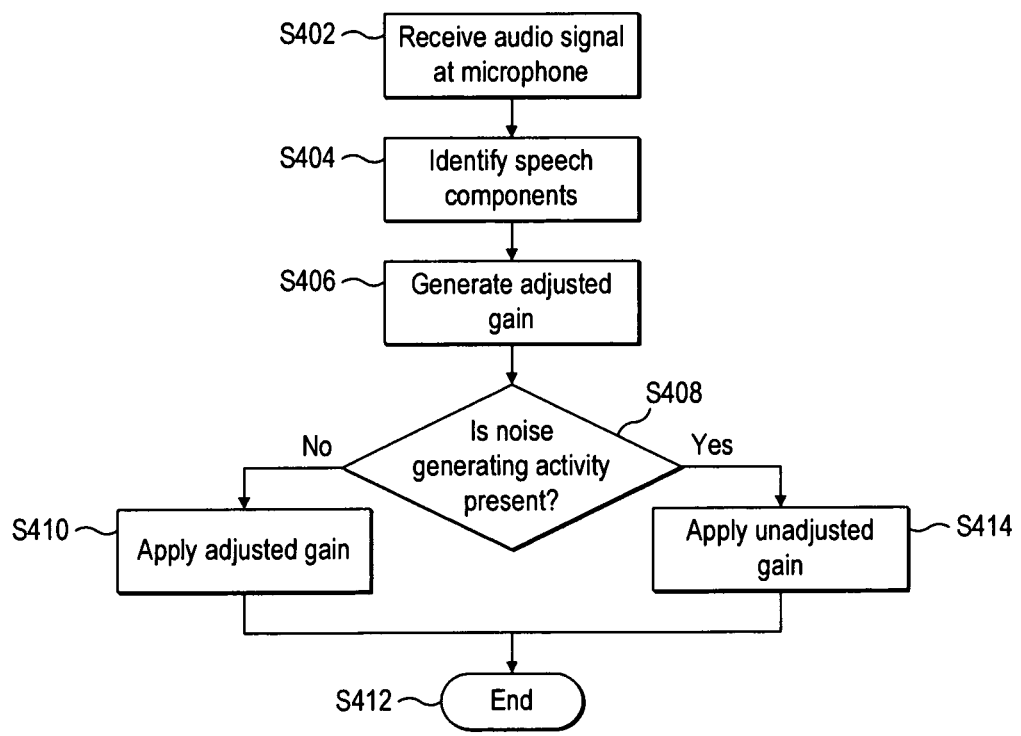
FIG. 4 is a flowchart of a process for applying gain to an audio signal according to a second embodiment.

With reference to FIG. 4 there is now described a process for applying gain to an audio signal according to a second embodiment. Steps S402 to S406 correspond to steps S302 to S306 of the first embodiment described above with reference to FIG. 3. That is, in step S402 an audio signal is received at the microphone 120 of the user terminal 104. In step S404 speech components in the audio signal are identified and in step S406 adjusted gains are generated.

However, in the second embodiment, the adjusted gain is not applied as soon as it is generated. Instead, the adjusted gain is only applied if it is subsequently determined that no noise generated by an activity resulting in an input signal to the user terminal 104 is present in the audio signal. As described above, the time taken to generate the adjusted gain $t_1$ is typically shorter than the time taken to determine that an input signal has been input which is associated with a noise generating activity $t_2$. The method will wait for a time of at least $t_2$ from receiving the audio signal before applying an adjusted gain which has been generated based on the received audio signal. This is achieved with the following steps S408 to S414.

In step S408 it is determined whether noise generating activity is present based on the detection of input signals to the operating system 210. This is achieved in the same way as that described above in relation to step S310 of the first embodiment. If it is determined that noise generating activity is not present in step S408 then the method passes to step S410. The time $t_2$ taken for the operating system to determine whether noise generating activity is present is known. In step S410 an adjusted gain generated based on audio signals received at the microphone 120 at a time which is at least $t_2$ ago is applied. In this way, the adjusted gain is applied after time $t_2$, allowing time for it to be determined (in step S408) that no noise generating activity is present in the audio signal on which the adjusted gain has been generated. Following step S410 the method ends in step S412, wherein the adjusted gain will be applied to subsequent audio signals received at the microphone 120.

If in step S408 it is determined that noise generating activity is present in the audio signal that was received a time $t_2$ ago, then any adjusted gain that has been generated based on the audio signal that was received a time $t_2$ ago will not be applied to the audio signal. Instead the unadjusted gain (i.e. the gain applied to the audio signal before the time at which the input signal was generated) is applied to the audio signal. As described above, the gain can comprise one or both of analogue gain and digital gain. Following step S414 the method ends in step S412 and the adjusted gain generated in step S406 is not applied to the audio signal.

The first embodiment described above in which gain adjustments are applied (in step S308) when they are generated but then are reverted (in step S312) if an input signal is detected is particularly suited for adjusting the digital gain applied by the digital gain block 230. A delay is undesired when applying the digital gain because a delay will interfere with the fast reacting properties that the digital gain block 230 is required to possess. Applying adjusted digital gains and then reverting the digital gain adjustments when an input signal is detected will avoid adding unnecessary delay at the digital gain block 230. This will ensure that when input signals are detected, any adjustments made on the basis of the noise generated by activity causing the input signal will be reverted, i.e. the digital gain is set to that used before the input signal was generated. That is, where there has been speech in the audio signal prior to the generation of the input signal, the digital gain is based on speech signals that were received at the microphone 120 prior to the generation of the input signal.

However, the second embodiment described above in which gain adjustments are delayed before being applied is particularly suited for adjusting the analogue gain applied by the microphone 120, which applies its gain before converting the signal from analogue to digital representation. In this case, a delayed reaction enables gain adjustments generated in the pre-processor block 224 to be cancelled before being sent as a request to the operating system for changing the analogue gain setting in the microphone 120. The request to change the analogue gain settings can sometimes cause stalls and should be done only when considered necessary. Therefore the second embodiment in which a delay is added will have the desirable property of reducing the number of calls to the operating system requesting a new analogue gain setting.

It is possible to apply the process of the first embodiment for adjusting digital the gain and at the same time apply the process of the second embodiment for adjusting analogue the gain.

In the embodiments described above, both an analogue gain (using analogue to digital converter block 220) and a digital gain (using digital gain block 230) are applied to the audio signal. In other embodiments, only an analogue gain is applied to the audio signal. In still other embodiments, only a digital gain is applied to the audio signal. In some embodiments the analogue gain may be applied using the microphone 120 rather than the analogue to digital converter block 220.

In alternative embodiments to those described above, the analysis of the audio signal to identify components having speech characteristics may be performed by means other than the pre-processing block 224, as would be apparent to a person that is skilled in the art.

The present invention is able to reliably revert any gain adjustments that are made by the AGC mechanism during times at which keyboard tapping, or other noise generating activity which generates input signals detectable by the operating system, is present. Any gain adjustments made within a time period less than 100 ms before the detection of the input signal may be reverted, or not applied at all. The present invention does not rely on computationally expensive signal processing for detection of the generated noise, and instead a polling function in the operating system notifies the AGC mechanism when the input signals are detected.

The present invention chooses between reverting any gain adjustments that were performed during times of detected keyboard tapping or adding a delay to the gain adjustments, and cancelling adjustments that were generated during times of detected keyboard tapping such that the adjustments are not applied.

The signal processing means of the user terminal 104 is used to analyse the received audio signal to identify signal components having speech characteristics in the audio signal, and to determine that the input signal is input from the input means. Another input to the signal processing means may be from a fan or hard disk of the user terminal 104 (not shown in the figures). When the fan is switched on it will generate noise which may be picked up by the microphone 120. Similarly, when the hard disk is operated it will generate noise which may be picked up by the microphone 120. The signal processing means can use input signals from the fan and the hard disk respectively to determine when the fan and/or the hard disk are in use. In some embodiments the signal processing means can use the input signal from the fan and/or hard disk in same way as an input signal from the keyboard 116 or the mouse 118. In this way, any adjustments made to the gain applied to the audio signal while the fan and/or hard disk are generating noise can be cancelled or reverted in the same way as described above in relation to adjustments made when an input signal is input to the signal processing means from the keyboard 116 or the mouse 118.

In the embodiments described above the audio signal is a speech signal comprising components having speech characteristics. In alternative embodiments, the audio signal may be a different type of audio signal having different characteristic signal components. In those alternative embodiments, the gain applied to the audio signal can be adjusted based on the signal strength of the characteristic signal components in the audio signal. Noise generated as a result of producing an input signal (such as keyboard tapping) might affect the gain applied to the audio signal. In the same way as described above in relation to a speech signal, the affect of the generated noise on the applied gain can be advantageously reduced for the different types of audio signal. For example, the audio signal may include music and the characteristic components may include sounds produced by one or more instruments.

In the embodiments described above the adjustments made to the gain during periods of noise generating activity resulting in input signals to the computing system are either cancelled before they are applied or reverted once the input signal is determined. However, in alternative embodiments, some of the adjustments made to the gain (e.g. during periods of keyboard tapping) may be applied. For example the changes made to the gain may be reduced in magnitude, i.e., the gain change is only partially applied. This can be advantageous if the computing system is not sure whether a received audio signal is a keytap or speech. The decision of how large a part of the gain change to apply immediately may be dependent on one or more signal classification methods. Furthermore, the gain may be adjusted during the periods in which input signals (such as keytaps) are received at the computing system, but the gain may only be reduced during such periods. Alternatively, the gain may only be increased during such periods.

While this invention has been particularly shown and described with reference to preferred embodiments, it will be understood to those skilled in the art that various changes in form and detail may be made without departing from the scope of the invention as defined by the appendant claims. In particular, the invention is described above in relation to the use of audio signals in a call between users over a P2P communication system, but the invention may be equally applied to audio signals for use in other scenarios as would be apparent to a skilled person.

The invention claimed is:
1. A method comprising:
receiving an audio signal;
analysing the received audio signal to identify characteristic signal components in the audio signal;
generating an adjusted gain for the audio signal based on a signal strength of signal components identified in the audio signal;
waiting for a specified period of time after generating the adjusted gain, independent of a signal strength of the audio signal, before applying the adjusted gain to the audio signal;

in an event of receiving a notification from an operating system indicating that an input signal is detected prior to expiration of the specified period of time:
  reducing an overall magnitude of the adjusted gain for the audio signal; and
  applying the reduced overall magnitude of the adjusted gain to the audio signal dependent on the notification from the operating system; and
in an event that an input signal is not detected prior to expiration of the specified period of time, applying the adjusted gain to the audio signal.

2. The method of claim 1 wherein applying the adjusted gain to the audio signal further comprises applying the adjusted gain only if the adjusted gain is greater than an unadjusted gain.

3. The method of claim 1 wherein applying the adjusted gain to the audio signal further comprises applying the adjusted gain only if the adjusted gain is less than an unadjusted gain.

4. The method of claim 1 wherein the adjusted gain is generated at a first time delay $t_1$ after receiving the audio signal, and the specified period of time is a second time delay $t_2$, wherein the first time delay $t_1$ is less than the second time delay $t_2$.

5. The method of claim 4 wherein the adjusted gain is applied to the audio signal at a third time delay $t_3$ after receiving the audio signal, where $t_1 \leq t_3 < t_2$.

6. The method of claim 4 wherein the adjusted gain is applied to the audio signal at a fourth time delay $t_4$ after receiving the audio signal only if the input signal has not been determined within the fourth time delay, where $t_2 \leq t_4$.

7. The method of claim 1 further comprising converting the received audio signal from the analogue domain to the digital domain, wherein the adjusted gain is selectively applied to the audio signal in at least one of the analogue domain and the digital domain.

8. The method of claim 1 wherein the input signal corresponds to an input device activity.

9. The method of claim 1 wherein the characteristic signal components have speech characteristics.

10. A computing system for modifying an audio signal, the computing system comprising:
  receiving means for receiving the audio signal;
  input means for generating an input signal;
  signal processing means for analysing the received audio signal to identify characteristic signal components in the audio signal, and for determining that the input signal is input from the input means, the input signal resulting from an activity which generates noise in the audio signal; and
  gain control means for selectively applying an adjusted gain to the audio signal based on the determination that the input signal is input from the input means, and configured to perform operations including:
    generating the adjusted gain for the audio signal based on a signal strength of signal components identified in the input signal;
    waiting for a specified period of time after generating the adjusted gain, independent of a signal strength of the audio signal, before applying the adjusted gain to the audio signal;
    in an event that a notification is received from an operating system indicating that an input signal is detected prior to expiration of the specified period of time:
      reducing an overall magnitude of the adjusted gain for the audio signal; and
      applying the reduced overall magnitude of the adjusted gain to the audio signal dependent on the notification from the operating system; and
    in an event that an input signal is not detected prior to expiration of the specified period of time, applying the adjusted gain to the audio signal.

11. The computing system of claim 10 further comprising converting means for converting the received audio signal from the analogue domain to the digital domain, wherein the gain control means comprises at least one of analogue gain control means for selectively applying the adjusted gain to the audio signal in the analogue domain and digital gain control means for selectively applying the adjusted gain to the audio signal in the digital domain.

12. The computing system of claim 10 wherein the input means comprises one of a keyboard and a mouse.

13. The computing system of claim 10 further comprising:
  a buffer for buffering the received audio signal; and
  reading means for reading the received audio signal out of the buffer for use by the signal processing means.

14. A system comprising:
  one or more processors; and
  at least one memory storing instructions that are executable by the one or more processors to cause the system to perform operations including:
  generating an adjusted gain for an audio signal based on a signal strength of signal components identified in the audio signal;
  waiting for a specified period of time after generating the adjusted gain, independent of a signal strength of the audio signal, before applying the adjusted gain to the audio signal;
  in an event that an input signal is detected prior to expiration of the specified period of time:
    changing the adjusted gain based on one or more signal classification methods, the changed adjusted gain being a partial amount of the adjusted gain; and
    applying the changed adjusted gain to the audio signal; and
  in an event that an input signal is not detected prior to expiration of the specified period of time, applying the adjusted gain to the audio signal.

15. The system of claim 14, wherein the adjusted gain is generated at a first time delay $t_1$ after receiving the audio signal, and the specified period of time is a second time delay $t_2$, wherein the first time delay $t_1$ is less than the second time delay $t_2$.

16. The computing system of claim 10, wherein the characteristic signal components have speech characteristics.

17. The computing system of claim 10, wherein the adjusted gain is generated at a first time delay $t_1$ after receiving the audio signal, and the specified period of time is a second time delay $t_2$, wherein the first time delay $t_1$ is less than the second time delay $t_2$.

18. The method of claim 1, wherein reducing the overall magnitude of the adjusted gain for the audio signal depends on one or more signal classification methods.

19. The method of claim 1, wherein the reduced overall magnitude of the adjusted gain is closer to an unadjusted gain than the adjusted gain is to the unadjusted gain.

20. The computing system of claim 10, wherein reducing the overall magnitude of the adjusted gain for the audio signal depends on one or more signal classification methods.

21. The computing system of claim 10, wherein applying the adjusted gain to the audio signal further comprises applying the adjusted gain only if the adjusted gain is greater than an unadjusted gain.

22. The computing system of claim 10, wherein applying the adjusted gain to the audio signal further comprises applying the adjusted gain only if the adjusted gain is less than an unadjusted gain.

23. The system of claim 14, wherein applying the changed adjusted gain to the audio signal further comprises applying the changed adjusted gain only if the changed adjusted gain is greater than an unadjusted gain.

24. The system of claim 14, wherein applying the changed adjusted gain to the audio signal further comprises applying the changed adjusted gain only if the changed adjusted gain is less than an unadjusted gain.

* * * * *